(12) United States Patent
Tanaka

(10) Patent No.: US 7,250,770 B2
(45) Date of Patent: Jul. 31, 2007

(54) SEMICONDUCTOR INTEGRATED CIRCUIT DEVICE

(75) Inventor: Isao Tanaka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/563,878

(22) Filed: Nov. 28, 2006

(65) Prior Publication Data

US 2007/0126429 A1   Jun. 7, 2007

(30) Foreign Application Priority Data

Dec. 2, 2005   (JP) .............................. 2005-349893

(51) Int. Cl.
*G01R 31/08* (2006.01)
*G01R 31/26* (2006.01)
*G01R 31/307* (2006.01)

(52) U.S. Cl. ..................... 324/527; 324/763; 324/765

(58) Field of Classification Search ................ 324/527, 324/765, 763
See application file for complete search history.

(56) References Cited

U.S. PATENT DOCUMENTS

| | | | |
|---|---|---|---|
| 4,697,140 A * | 9/1987 | Saito et al. ................. | 324/73.1 |
| 6,233,184 B1 * | 5/2001 | Barth et al. ................. | 365/201 |
| 6,429,029 B1 | 8/2002 | Eldridge et al. | |
| 6,609,236 B2 | 8/2003 | Watanabe et al. | |
| 2005/0156616 A1 * | 7/2005 | Morishita et al. ........... | 324/763 |
| 2005/0281119 A1 | 12/2005 | Shibata et al. | |
| 2007/0029384 A1 * | 2/2007 | Atherton ..................... | 235/435 |

FOREIGN PATENT DOCUMENTS

| JP | 2002-533738 | 10/2002 |
|---|---|---|
| WO | 00/39848 | 7/2000 |

OTHER PUBLICATIONS

U.S. Appl. No. 11/465,151 to Yamanaka et al., which was filed on Aug. 17, 2006.

* cited by examiner

*Primary Examiner*—Anjan Deb
(74) *Attorney, Agent, or Firm*—Greenblum & Bernstein, P.L.C.

(57) ABSTRACT

It is provided a semiconductor integrated circuit device capable of easily designing a large scale circuit, particularly a circuit of a system LSI designed by combining circuits using plural intellectual properties and the like. The semiconductor integrated circuit includes a driving unit which is connected to a driven circuit via a transmission line and supplies a driving signal for driving the driven circuit to the driven circuit, a switch which is inserted into the transmission line between the driven circuit and the driving unit and which causes the driving signal, which is to be supplied to the driven circuit, to flow or to be cut off, and a transmission unit which is connected to the transmission line between the switch and the driving unit, and which transmits, to the driven circuit, a test signal supplied from outside the semiconductor integrated circuit device instead of the driving signal.

14 Claims, 8 Drawing Sheets

SEMICONDUCTOR INTEGRATED CIRCUIT DEVICE

BACKGROUND OF THE INVENTION (1) Field of the Invention

The present invention relates to an evaluation and adjustment method of a semiconductor integrated circuit device, and particularly to an evaluation method of a System Large Scale Integration (LSI) which is designed based on Intellectual Property (IP).

(2) Description of the Related Art

It has been possible to manufacture a large scale integrated circuit onto one semiconductor chip by integrating complicated systems onto the semiconductor chip, following the dramatic increase in the number of transistors which can be integrated onto one semiconductor chip due to fine processing (for example, Patent Reference 1: Japanese Laid-Open Patent Application No. 2002-533738). Furthermore, the number of circuits, which do not contribute to normal operations of a Super Large Scale Integration (SLSI) such as test circuits and timing adjustment circuits, has been increased in order to test such large scale integrated circuit and to improve quality, and the wiring area has also been increased. With respect to circuits to be used to perform testing easier, wiring areas and the amount of power consumption have been reduced by sharing the circuits and controlling the circuits when they are not activated, and the like. However, in reality, a fundamental reduction in the number of circuits has not been realized.

SUMMARY OF THE INVENTION

Problems relating to circuit design such as timing design and the like are also found in addition to the aforementioned problem of the increase in the number of circuits. Specifically, there is, for example, a method of using intellectual properties (IP) as design assets, as a method of effectively designing a complicated large scale integrated circuit. However, each circuit using a different IP is designed based on an individual circuit design strategy. Therefore, a clock phase difference is caused between flip-flops when test scanning, which is a known testing method for a large integrated circuit, is performed. It is difficult to precisely execute testing when the difference exceeds an allowable value. Accordingly, the circuit design cannot be easily realized because it is necessary to design timing considering the phase difference which occurs at the time of testing, when designing a semiconductor integrated circuit device as an integrated circuit. Furthermore, the circuit design cannot be easily realized because, when the circuit is adjusted after being designed, only a single line for supplying a clock signal does not allow selecting and activating a local portion so as to evaluate the portion.

Whereas a method of facilitating the circuit design by forming a portion of the test circuit on another die is suggested in the semiconductor integrated circuit device disclosed in Patent Reference 1, the suggested method can be used only for facilitating the degenerate failure test, not for solving other problems that a test circuit can be used only for the test evaluation, and that clock phases need to be adjusted between blocks.

The present invention is conceived of the aforementioned problems, and has an object to provide a semiconductor integrated circuit device capable of facilitating designing a large scale integrated circuit, particularly a system LSI designed with a combination of plural circuits using different IPs.

In order to achieve the aforementioned object, the semiconductor integrated circuit device of the present invention is a semiconductor integrated circuit device which includes: a driving unit which is connected to a circuit via a transmission line and which is operable to supply, to the circuit, a driving signal for driving the circuit; a first switch which is inserted into the transmission line between the circuit and said driving unit and which causes the driving signal, which is to be supplied to the circuit, to flow or to be cut off; and a transmission unit which is connected to the transmission line between the first switch and the circuit and which transmits, to the circuit, an external signal supplied from outside the semiconductor integrated circuit device instead of the driving signal. Here, the semiconductor integrated circuit device may include a control unit which turns the first switch on when the semiconductor integrated circuit device is operated in a normal mode, and turns the first switch off when the semiconductor integrated circuit device is operated in a test mode. Furthermore, the first switch may be a tri-state buffer or a CMOS switch. In addition, the transmission unit may include: a pad to which the external signal is supplied; and a second switch which is connected to a transmission line between the first switch and the circuit and which causes the external signal sent from the pad to flow or to be cut off.

With this configuration, the external signal inputted from outside the semiconductor integrated circuit device is transmitted to the circuit instead of the driving signal when the first switch is being cut off. Therefore, in the case where the external signal is a test signal, it is unnecessary to design timing considering the phase difference which occurs at the time of test operation, when designing the semiconductor integrated circuit device. Accordingly, a design of an integrated circuit using plural IPs and the like, particularly a design of timing, can be facilitated. Furthermore, the circuit design can be facilitated because this configuration allows operating and evaluating only a single local circuit in the semiconductor integrated circuit, when the semiconductor integrated circuit device is adjusted and the like.

Furthermore, the semiconductor integrated circuit device may include a measurement unit which outputs a signal transmitted to the circuit.

This configuration allows checking the state of phase relationship, in the circuit, of the external signal which is externally inputted via the transmission unit. Therefore, testing efficiency can be improved, in the case where the external signal is a test signal.

Furthermore, the transmission unit may include: a capacitive coupled pad to which the external signal is supplied; and a second switch which is connected to a transmission line between the first switch and the circuit and which causes the external signal sent from the capacitive coupled pad to flow or to be cut off. Also, the transmission unit may include: an inductor to which the external signal is supplied and which serves as an antenna; and a second switch which is connected to the transmission line between the first switch and the circuit and which causes the external signal sent from the inductor to flow or to be cut off.

With this configuration, a pad area for earning a capacity value necessary for signal transmission requires an area smaller than the area required by the signal transmission method using a normal direct probe needle contact, so that a small semiconductor integrated circuit device can be manufactured. Furthermore, the allowable amount of positional difference with the object is increased, allowing the alignment precision to be relaxed. Therefore, signals can be inputted more easily. In addition, a mechanical probe needle contact is not required so that the possibility of degrading performance of a product due to damaging can be lowered.

Furthermore, the external signal may be a clock signal.

In the case where the circuit includes a flip flop which performs shift register operation at the time of scan testing, this configuration allows a clock signal, which is used for the shift register operation by the flip-flop, to be inputted to the circuit through a line different from the signal transmission line for the driving signal so that timing can be designed without considering the phase difference which occurs at the time of test operation. As a result, the circuit design can be facilitated.

This configuration also allows the clock signal for testing to be externally inputted at arbitral timing. Therefore, the waveform of the signal inputted to the circuit can be controlled without relying on the normal timing design. Consequently, in the case where the circuit includes a flip-flop which operates as a shift register at the time of scan testing, testing efficiency for scan testing can be improved because margins of respective holding and setting-up due to path delay between flip-flops can be changed by evaluating the circuit while changing the clock phases between the flip-flops which perform shift register operation.

The semiconductor integrated circuit device includes a plurality of the circuits, driving units, first switches, and transmission units. Each of the driving units is connected to one of the circuits via a transmission line and may supply, to the connected circuit, a driving signal for driving the connected circuit. Each of the first switches is inserted into the transmission line between a respective one of the circuits and a respective one of the driving units, and may cause the driving signal, which is supplied to the connected circuit, to flow or to be cut off. Each of the transmitting units is connected to the transmission line between a respective one of the switches and a respective one of the circuits, and may transmit the external signal to the connected circuit instead of the driving signal.

In the case where the external signal is a test signal, the phase difference between the circuits can be adjusted and synchronized by controlling the waveforms of test signals which are externally inputted to the respective circuits, even in the case where timing and phase of respective test signals are different for respective circuits.

The semiconductor integrated circuit device may include a first substrate in which the circuit, driving unit, first switch and transmission unit are formed; and a second substrate which is connected to the transmission unit and on which a generation unit which generates the external signal is formed. Furthermore, it may include a control unit which controls the first switch so that the first switch is periodically turned ON and OFF.

With respect to the second substrate which is designed for testing, this configuration allows relaxing the restrictions on power consumption and chip size, so that sufficient driving performance can be given as a clock supply source, for example. Furthermore, loading required for designing can be significantly reduced because a single second substrate can be used for testing plural first substrates.

According to the semiconductor integrated circuit device of the present invention, it is possible to easily design a large-scale circuit, particularly a circuit of system LSI designed as a combination of circuits using plural IPs. Furthermore, testing efficiency can be improved, and a smaller semiconductor integrated circuit can be manufactured. In addition, signal input facility can be improved.

Accordingly, the present invention can realize an LSI which is useful for a test assembly method for a large-scale integrated circuit designed particularly based on IPs. Furthermore, a system LSI with a self-adjustment function can be realized as a form of System In Package (SIP) together with a test die which generates a signal for adjustment.

As further information about technical background to this application, the disclosure of Japanese Patent Application No. 2005-349893 filed on Dec. 2, 2005 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Hereinafter, it shall be described about a semiconductor integrated circuit device according to embodiments of the present invention, with reference to the attached drawings.

First Embodiment

Figure 1:
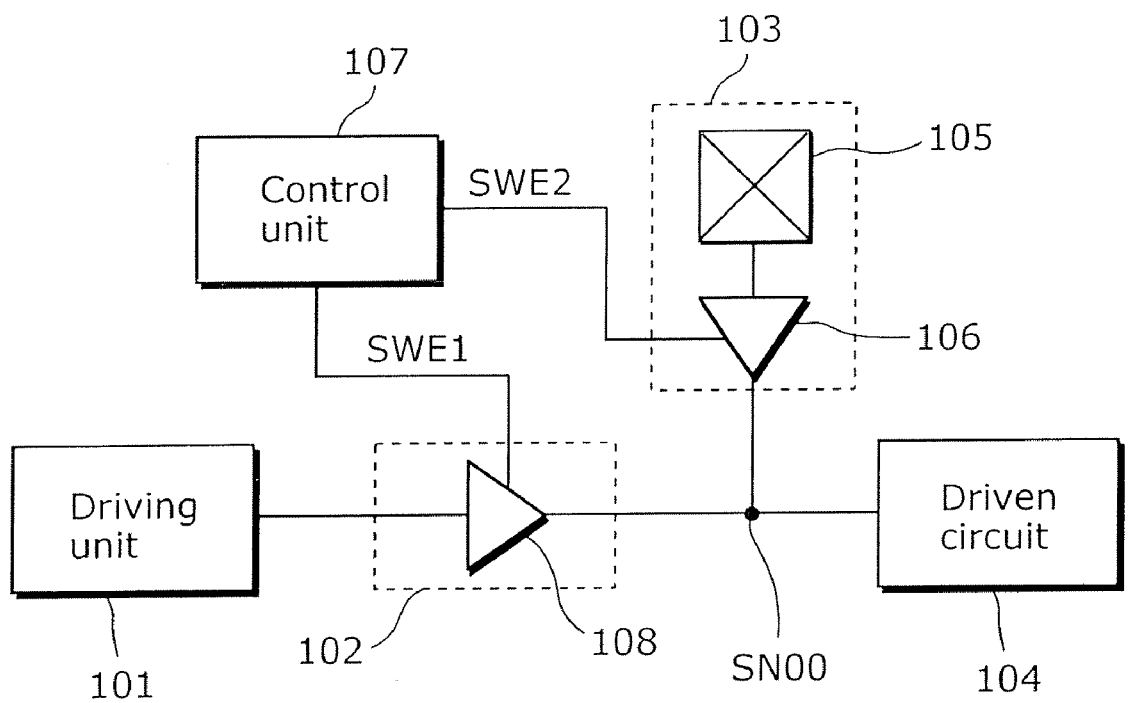
FIG. 1 is a diagram showing a schematic configuration of a semiconductor integrated circuit device according to a first embodiment of the present invention.

FIG. 1 is a diagram showing a schematic configuration of a semiconductor integrated circuit device according to the first embodiment of the present invention.

The semiconductor integrated circuit device includes a driving unit 101, a switch 102, a transmitting unit 103, a driven circuit 104, and a control unit 107. Note that, the driving unit 101, switch 102, transmitting unit 103, and control unit 107 are examples of a driving unit, a first switch, a transmitting unit, and a control unit of the present invention, respectively.

The driven circuit 104 is, for example, a circuit to be evaluated and adjusted, or a circuit including a flip-flop which performs a shift register operation at the time of scan testing.

The driving unit 101 is connected to the driven circuit 104 through a transmission line, receives a supply of a clock signal, generates a driving signal for driving the driven circuit 104, and supplies the driving signal to the driven circuit 104.

The switch 102 is a switch circuit inserted into the transmission line between the driven circuit 104 and the driving unit 101. It causes the driving signal, which is to be supplied from the driving unit 101 to the driven circuit 104, to flow or to be cut off. The switch 102 is made up of a tri-state buffer 108. The tri-state buffer 108 is controlled by a control signal SWE1 sent from the control unit 107, and electrically separates a signal node SN00 and the driving unit 101.

The transmitting unit 103 is connected to the transmission line between the switch 102 and the driven circuit 104, and transmits, to the driven circuit 104, a test signal as an external signal supplied from outside the chip on which the semiconductor integrated circuit device is formed, in stead of a driving signal. For example, in the case where the driven circuit 104 is a circuit to be evaluated and the like, a driving signal for operating the whole or a part of the driven circuit 104 is supplied externally as a test signal. In the case where the driven circuit 104 is a circuit including a flip-flop which performs a shift register operation at the time of scan testing, a clock signal used for shift register operation by the flip-flop is supplied externally as a test signal. The transmitting unit 103 is made up of a contact pad 105 into which a test signal is externally inputted, and a tri-state buffer 106 which serves as a switch. The transmitting unit 103 externally drives the driven circuit 104 without using a bonding pad as an external terminal of the chip. The tri-state buffer 106 is controlled by a control signal SWE2 sent from the control unit 107, and electrically separates the signal node SN00 and the contact pad 105. Note that, the tri-state buffer 106 is an example of a second switch of the present invention.

The control unit 107 controls the tri-state buffers 106 and 108 so that only one of the driven signal sent from the driving unit 101 and the test signal sent from the transmitting unit 103 is supplied to the driven circuit 104. Specifically, the tri-state buffers 106 and 108 are controlled so that the tri-state buffer 106 cuts off the test signal in a normal operation mode by which the semiconductor integrated circuit device is normally operated, and that the tri-state buffer 108 cuts off the driving signal in a test operation mode by which the semiconductor integrated circuit device is operated for a test. Here, the normal operation is an operation which is originally aimed to be performed by the semiconductor integrated circuit device and is achieved by functions of whole elements which constitute the semiconductor integrated circuit device. Furthermore, the test operation is an experimental operation which is aimed to be performed for testing the driven circuit 104, and is achieved by functions of partial elements which constitute the semiconductor integrated circuit device.

Figure 2:
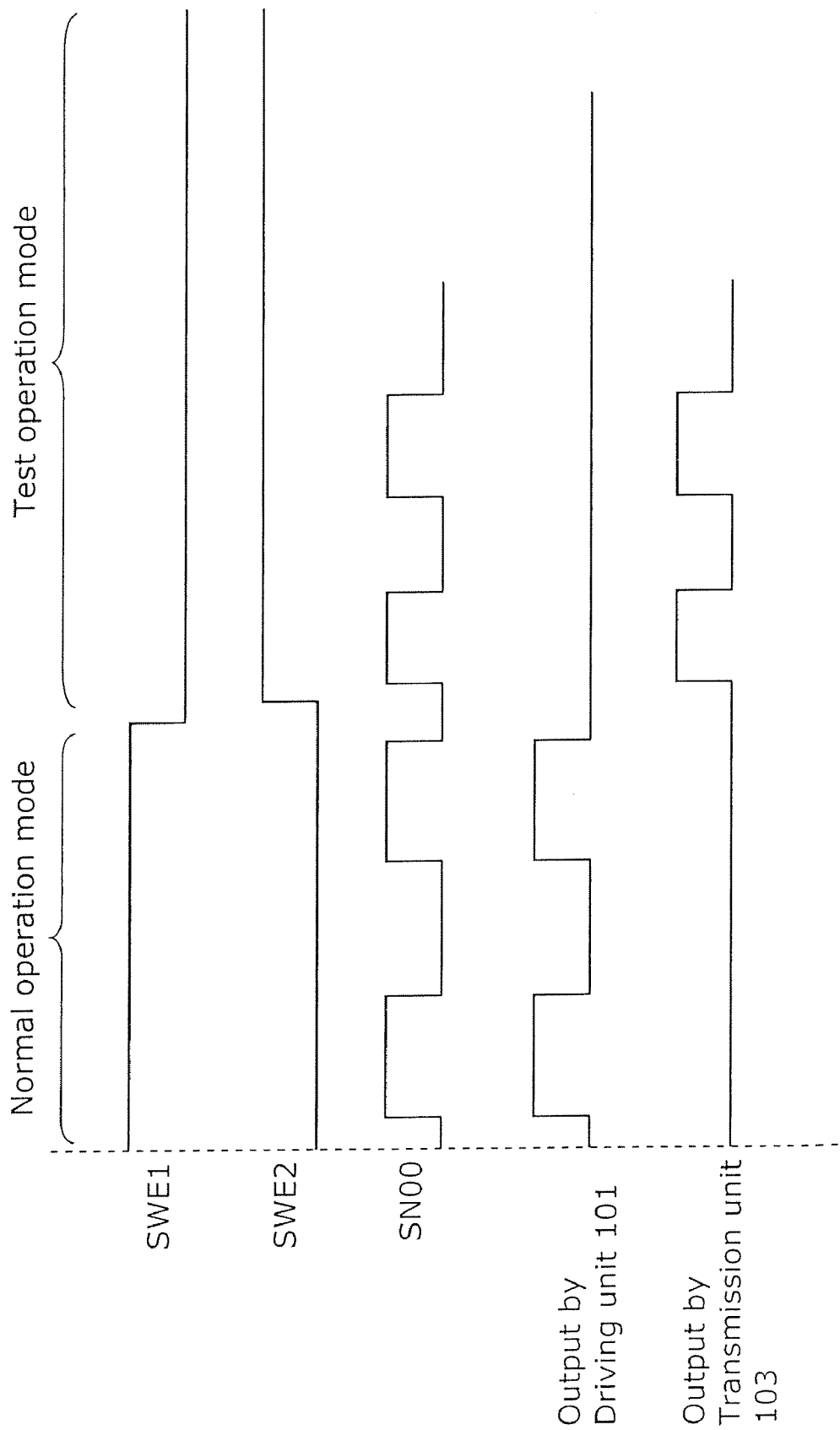
FIG. 2 is a timing chart showing a circuit operation of the semiconductor integrated circuit device according to the first embodiment.

Next, it shall be described a circuit operation of the semiconductor integrated circuit device having the aforementioned configuration. FIG. 2 is a timing chart showing a circuit operation of the semiconductor integrated circuit device.

In this semiconductor integrated circuit device, in the normal operation mode, the control signal SWE1 and control signal SWE2 sent from the control unit 107 become respectively a high level signal and a low level signal so that the tri-state buffer 108 is in an output-enable state and the tri-state buffer 106 is in high-impedance state. Accordingly, in the normal operation mode, the test signal inputted from outside the chip is cut off by the transmitting unit 103 and only the driving signal, which is based on the normal system clock signal and is outputted by the driving unit 101 placed on the chip, is transmitted to the signal node SN00 and is supplied to the driven circuit 104.

On the other hand, in the test operation mode, the control signal SWE1 and control signal SWE2 sent from the control unit 107 become respectively a low level signal and a high level signal so that the tri-state buffer 108 is in high-impedance state and the tri-state buffer 106 is in an output-enable state. Accordingly, in the test operation mode, the driving signal outputted from the driving unit 101 on the chip is cut off by the switch 102, and only the test signal inputted from outside the chip is transmitted to the signal node SN00 and is supplied to the driven circuit 104.

Here, the test signal is supplied from a signal supply source formed on a chip which is different from the chip on which the semiconductor integrated circuit device is formed, and is supplied to the semiconductor integrated circuit device by electrically connecting the signal supply source with the contact pad 105 using a contact unit (for example, a probe of a probe card, a solder ball, and the like).

As described in the above, the semiconductor integrated circuit device according to the present embodiment can directly provide the test signal to the driven circuit 104 from outside the chip without using the bonding pad placed on the chip. Therefore, in the case where the driven circuit 104 includes a flip-flop which performs a shift register operation at the time of scan testing, a clock signal used for shift register operation by the flip-flop can be inputted to the driven circuit 104 through a line which is different from a signal transmission line used in the normal operation mode. As a result, timing can be designed without considering the phase difference in the test operation mode and the circuit design can be facilitated. Furthermore, in the case where the driven circuit 104 is a circuit to be adjusted and the like, it is possible to operate and evaluate only the driven circuit 104 so that the circuit design can be facilitated.

In addition, the semiconductor integrated circuit device according to the present embodiment can input the test signal to the driven circuit 104 from outside the chip at arbitral timing in the test operation mode. Therefore, in the case where the driven circuit 104 includes a flip-flop which performs a shift register operation at the time of scan testing, margins respectively for holding and setting-up due to path delay between flip-flops which performs a shift register operation can be changed by evaluating the clock phases between the flip-flops while changing the clock phase. As a result, path delay analysis can be efficiently performed. In other words, testing efficiency for scan testing can be improved.

It should be note that, whereas the switch 102 is made up of the tri-state buffer 108 in the semiconductor integrated circuit device according to the present embodiment, a CMOS switch may be used as the switch 102. In other words, the switch 102 is only required to separate the output by the driving unit 101 from the signal node SN00. In the case where the switch 102 is the CMOS switch, it is possible to manufacture a smaller semiconductor integrated circuit.

Furthermore, whereas the transmitting unit 103 includes the tri-state buffer 106 as a switch in the semiconductor integrated circuit device according to the present embodiment, the transmitting unit 103 may include a CMOS switch as the switch. Specifically, the transmitting unit 103 is only required to separate the output by the contact pad 105 from the signal node SN00. In the case where the switch is the CMOS switch, it is possible to manufacture a smaller semiconductor integrated circuit device.

Second Embodiment

Figure 3:
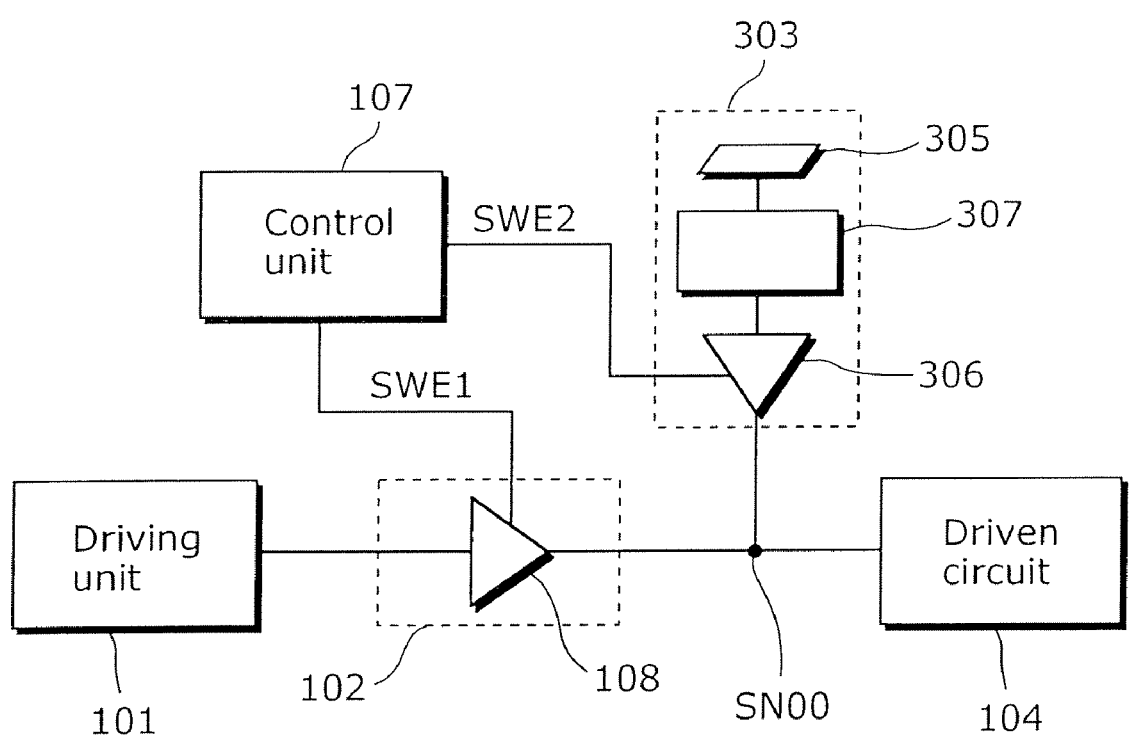
FIG. 3 is a diagram showing a schematic configuration of a semiconductor integrated circuit device according to a second embodiment of the present invention.

FIG. 3 is a diagram showing a schematic configuration of a semiconductor integrated circuit device according to the second embodiment of the present invention.

The semiconductor integrated circuit device includes a driving unit 101, a switch 102, a transmitting unit 303, a driven circuit 104, and a control unit 107. Note that, the transmitting unit 303 is an example of the transmitting unit of the present invention.

The transmitting unit 303 is connected to the transmission line between the switch 102 and the driven circuit 104, and transmits, to the driven circuit 104, the test signal supplied from outside the chip on which the semiconductor integrated circuit device is formed, instead of the driving signal. The transmitting unit 303 includes a capacitive coupled pad 305 which is connected to the outside by capacitive coupling, and into which the test signal is inputted from the outside, a receiver 307 which amplifies the test signal inputted via the capacitive coupled pad 305, and a tri-state buffer 306 which serves as a switch. It drives the driven circuit 104 from the outside without using the bonding pad which is an external terminal of the chip. The tri-state buffer 306 is controlled by the control signal SWE2 sent by the control unit 107, and electrically separates the signal node SN00 from the capacitive coupled pad 305. Note that, the tri-state buffer 306 is an example of the second switch of the present invention.

Figure 4B:
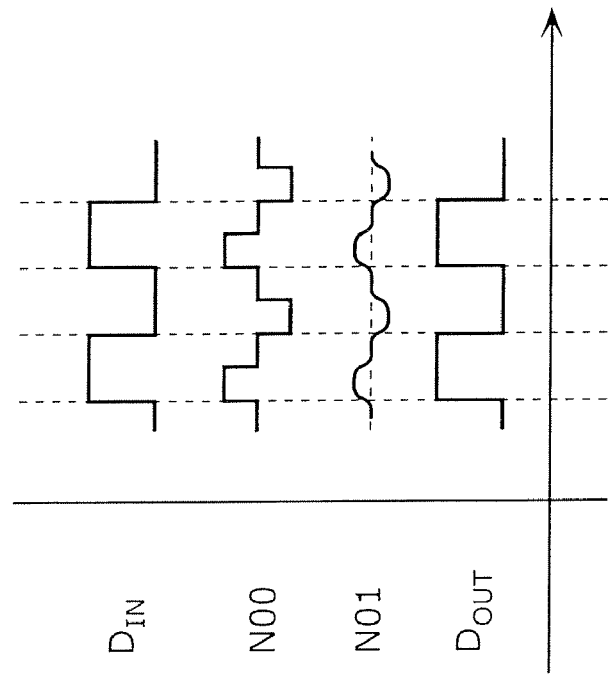
FIG. 4B is a diagram showing waveforms of a test signal.
Figure 4A:
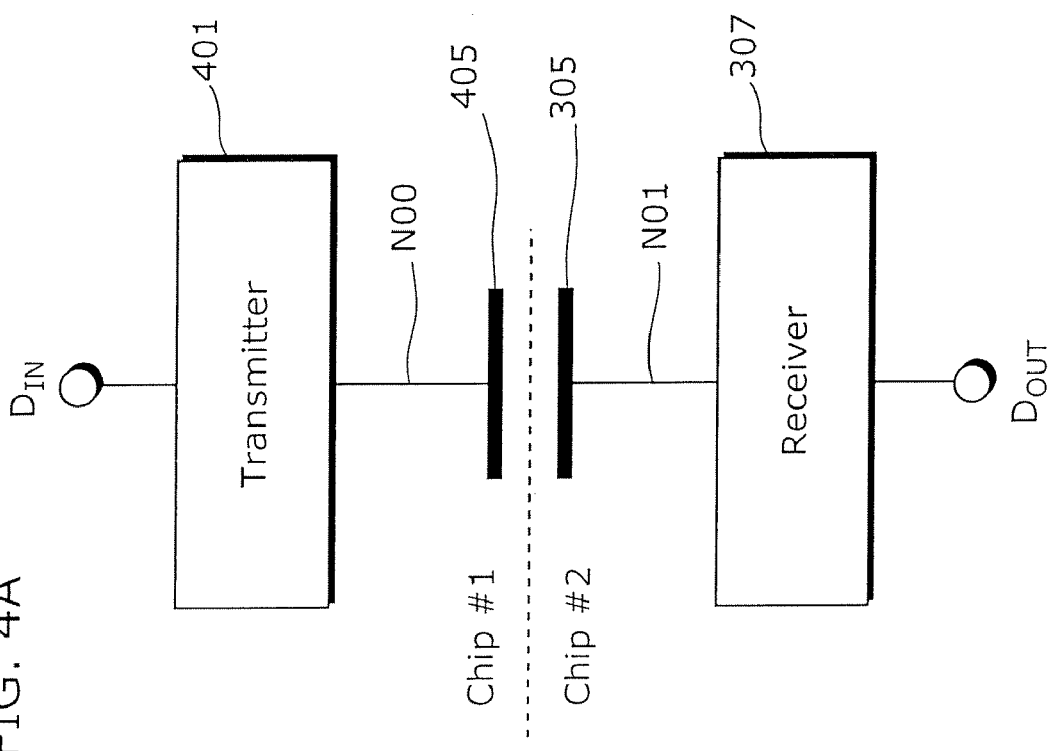
FIG. 4A is a diagram showing a connection state of a capacitive-coupled pad of the semiconductor integrated circuit device.

FIG. 4A is a diagram showing a connection state between the capacitive coupled pad 305 and the capacitive coupled pad 405 formed on a chip #1 which is different from a chip #2 on which the semiconductor integrated circuit device is formed. FIG. 4B is a diagram showing waveforms of the test signal.

As shown in FIG. 4A, the chip #1 and chip #2 are capacitive coupled through the capacitive coupled pads 305 and 405. As shown in FIG. 4B, in the capacitive coupled chips #1 and #2, the test signal $D_{IN}$ is transmitted to the chip #2 by capacitive coupling after the waveform of the test signal $D_{IN}$ is converted by the transmitter 401. The waveform of the transmitted signal is shaped by the receiver 307 of the chip #2, and is outputted as a test signal $D_{OUT}$.

A fundamental circuit operation of the semiconductor integrated circuit device having the aforementioned configuration is the same as that of the semiconductor integrated circuit device of the first embodiment.

As described in the above, according to the semiconductor integrated circuit device of the present embodiment, it is possible to facilitate the circuit design based on the same reasoning applied to the semiconductor circuit device of the first embodiment. Furthermore, testing efficiency can be improved.

Furthermore, in the semiconductor integrated circuit device according to the present embodiment, the test signal is inputted to the semiconductor integrated circuit device using a signal transmitting method by capacitive coupling which can reduce the pad area for earning a capacitance value necessary for signal transmission compared to the general signal transmission method using a direct contact of a probe needle. As a result, it is possible to manufacture a smaller semiconductor integrated circuit device. Also, the signal is transmitted by capacitive coupling so that the amount for allowing differences in the positional relationship with a targeted object can be increased and alignment precision can be relaxed. Consequently, evaluation of circuit can be more easily performed. Similarly, the signal is transmitted by capacitive coupling so that the mechanical contact of a probe needle is not required, reducing the possibility of causing a performance degradation of the circuit due to damaging.

Third Embodiment

Figure 5:
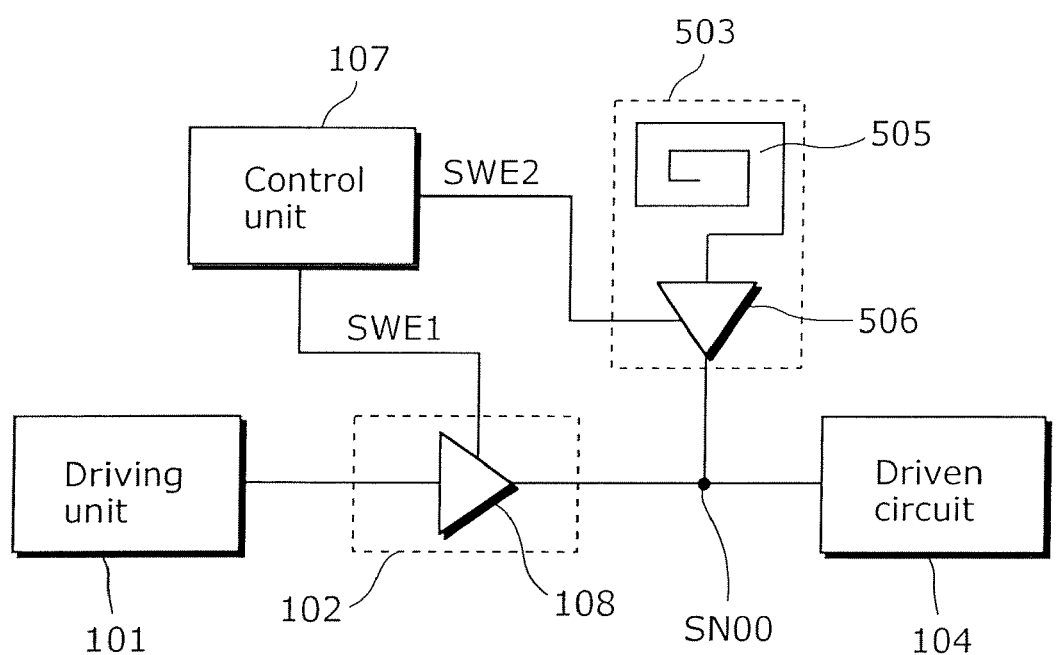
FIG. 5 is a diagram showing a schematic configuration of a semiconductor integrated circuit device according to a third embodiment of the present invention.

FIG. 5 is a diagram showing a schematic configuration of a semiconductor integrated circuit device according to the third embodiment of the present invention.

The semiconductor integrated circuit device includes a driving unit 101, a switch 102, a transmitting unit 503, a driven circuit 104, and a control unit 107. Note that, the transmitting unit 503 is an example of the transmitting unit of the present invention.

The transmitting unit 503 is connected to the transmission line between the switch 102 and the driven circuit 104, and transmits, to the driven circuit 104, a test signal supplied from outside the chip on which the semiconductor integrated circuit device is formed, instead of a driving signal. The transmitting unit 503 serves as an antenna, and is made up of an inductor 505 into which the test signal is externally inputted, and a tri-state buffer 506 which serves as a switch. The transmitting unit 503 directly drives the driven circuit 104 externally by wireless transmission without using the bonding pad which is an external terminal of the chip. The tri-state buffer 506 is controlled by the control signal SWE2 sent by the control unit 107, and electrically separates the signal node SN00 from the inductor 505. Here, the waveform of the test signal to be inputted into the inductor 505 is converted by the external transmitter, and is adjusted by the receiver which is connected between the inductor 505 and the tri-state buffer 506. Note that, the tri-state buffer 506 is an example of the second switch of the present invention.

The fundamental circuit operation of the semiconductor integrated circuit device having the aforementioned structure is the same as that of the semiconductor integrated circuit device of the first embodiment.

As described in the above, the semiconductor integrated circuit device of the present embodiment allows facilitating the circuit design based on the similar reasoning applied to the semiconductor integrated circuit device of the first embodiment. In addition, it is possible to improve testing efficiency.

Furthermore, according to the semiconductor integrated circuit device of the present embodiment, the test signal is inputted to the semiconductor integrated circuit device using a wireless transmission method through the inductor 505 which does not cause a physical contact, instead of the normal signal transmission method through a direct contact of a probe needle. As a result, the bad impacts such as physical damage on a wafer itself due to the physical contact during the signal transmission are not given, preventing the performance deterioration of the circuit. Furthermore, the signal is transmitted through wireless transmission so that an amount of allowable differences in the positional misalignment with the targeted object can be increased and the alignment precision can be relaxed. Consequently, circuit evaluation can be further facilitated.

Fourth Embodiment

Figure 6:
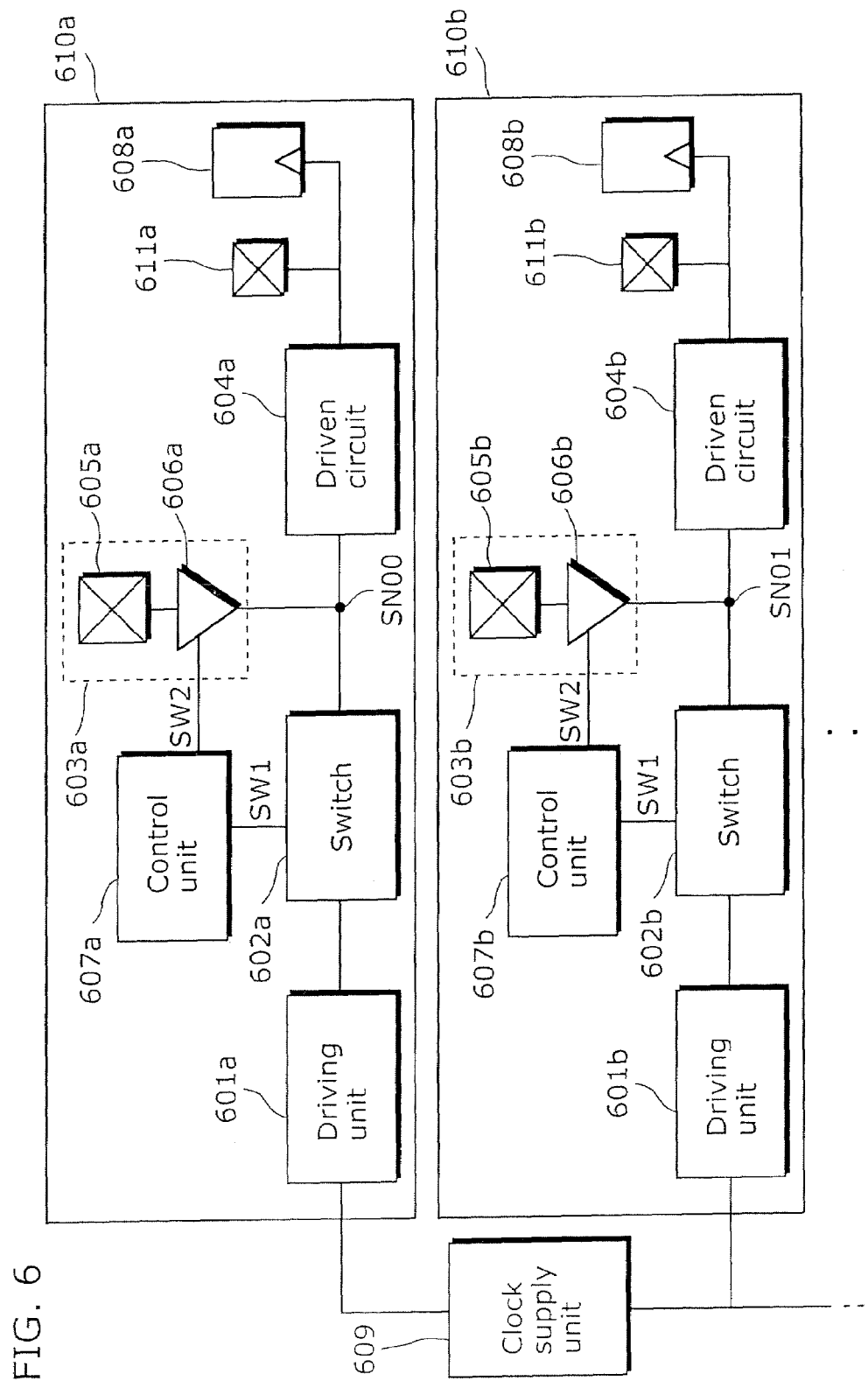
FIG. 6 is a diagram showing a schematic configuration of a semiconductor integrated circuit device according to a fourth embodiment of the present invention.

FIG. 6 is a diagram showing a schematic configuration of a semiconductor integrated circuit device according to the fourth embodiment of the present invention. The diagram shows the application of the present invention to supply lines of a clock signal in the different plural IP blocks.

The semiconductor integrated circuit device includes plural circuit blocks 610a and 610b using different IPs, and a clock supply unit 609. The circuit block 610a includes a driving unit 601a, a switch 602a, a transmitting unit 603a, a driven circuit 604a, a control unit 607a, a flip-flop 608a, and a measuring unit 611a. The circuit block 610b includes a driving unit 601b, a switch 602b, a transmitting unit 603b, a driven circuit 604b, a control unit 607b, a flip-flop 608b, and a measuring unit 611b. Note that, the driving units 601a and 601b, the switches 602a and 602b, the transmitting units 603a and 603b, the control units 607a and 607b, and the measuring units 611a and 611b are respectively the examples of a driving unit, a first switch, a transmitting unit, a control unit, and a measuring unit of the present invention.

The driving units 601a and 601b are connected, through transmission lines, to the driven circuits 604a and 604b, and to the flip-flops 608a and 608b, receive a clock signal supplied from the clock supply unit 609, generate a driving signal for driving the driven circuits 604a and 604b, and the flip-flops 608a and 608b, and supply the driving signal to the driven circuits 604a and 604b, and to the flip-flops 608a and 608b, respectively.

The switches 602a and 602b are switch circuits. The switch 602a is inserted into the transmission line between the driven circuit 604a and the driving unit 601a, and causes the driving signal supplied from the driving unit 601a to the driven circuit 604a to flow or to be cut off. Similarly, the switch 602b is inserted into the transmission line between the driven circuit 604b and the driving unit 601b, and causes the driving signal supplied from the driving unit 601b to the driven circuit 604b to flow or to be cut off. The switches 602a and 602b are tri-state buffers. The tri-state buffers are controlled by the control signal SWE1 sent from the control units 607a and 607b, and electrically separate the signal nodes SN00 and SN01 from the driving units 601a and 601b, respectively.

The transmitting units 603a and 603b are respectively connected to the transmission lines which respectively connect the switches 602a and 602b to the driven circuits 604a and 604b, and supply, to the flip-flops 608a and 608b, the clock signal as a test signal which is supplied from outside the chip, on which the semiconductor integrated circuit device is formed, and which is used for shift register operation by the flip-flops 608a and 608b, in stead of the driving signal. The transmitting units 603a and 603b are respectively made up of contact pads 605a and 605b into which the test signal is externally inputted, and tri-state buffers 606a and 606b as switches, and directly drive the flip-flops 608a and 608b without using the bonding pads as the external terminals of the chips from outside the chips. The tri-state buffers 606a and 606b are controlled by the control signals SWE2 respectively sent by the control units 607a and 607b, and electrically separates the signal nodes SN00 and SN01 from the contact pads 605a and 605b. Note that, the tri-state buffers 606a and 606b are examples of the second switch of the present invention.

The control units 607a and 607b control the tri-state buffers so that either the driving signals sent from the driving units 601a and 601b or the clock signals sent from the transmitting units 603a and 603b are supplied to the driven circuits 604a and 604b, and to the flip-flops 608a and 608b. Specifically, the tri-state buffers are controlled so that in the normal operation mode for causing the semiconductor integrated circuit device to perform normal operation, the tri-state buffers 606a and 606b cut off the respective clock signals, and that in the test operation mode for causing the flip-flops 608a and 608b which perform shift register operation, the tri-state buffers of the switches 602a and 602b cut off the respective driving signals.

The measuring units 611a and 611b are measurement nodes for measuring timing at which signals arrive at the driven circuits 604a and 604b. The measuring units 611a and 611b are contact pads from which signals that have passed through the driven circuits 604a and 604b are outputted, and measure a signal using a signal transmission method through direct contact.

The fundamental circuit operation of the semiconductor integrated circuit device having the aforementioned configuration is the same as that of the semiconductor integrated circuit device of the first embodiment. Specifically, the SWE1 and SWE2 become respectively a high-level signal and low-level signal in the normal operation mode, and the SWE1 and SWE2 become respectively a low-level signal and high-level signal in the test operation mode for scan testing.

As described in the above, the semiconductor integrated circuit device of the present embodiment can facilitate the circuit design based on the same reasoning applied to the semiconductor integrated circuit device of the first embodiment. Furthermore, testing efficiency can be improved.

Furthermore, the semiconductor integrated circuit device of the present embodiment includes the measuring units 611a and 611b respectively connected to the transmission lines between the driven circuit 604a and the flip-flop 608a and between the driven circuit 604b and the flip-flop 608b, and can verify what phase relationship is taken, in the clock signal input units of the flip-flops 608a and 608b, by the clock signal inputted, via the transmitting units 603a and 603b, from the test circuit placed outside the chip on which the semiconductor integrated circuit device is formed. Accordingly, a synchronous test using the same scanning chain can be performed on the circuit blocks 610a and 610b using different IPs, by inputting the clock signals so that the same clock phases are measured by the measuring units 611a and 611b. Specifically, in the case where different clock phases are measured for respective flip-flops, valid testing cannot be performed causing a mislatch unless the holding of the flip-flops in the scanning chain is sufficiently guaranteed. However, the semiconductor integrated circuit device of the present embodiment can adjust phases at arbitral timing by the control from outside the semiconductor integrated circuit device even in the case where clock configurations are different among circuit blocks, and verify the phases of the clocks inputted to the flip-flops so that scan testing on the circuit blocks using different arbitral IPs can be performed.

Note that, the measuring units 611a and 611b are not contact pads but capacitive coupled pads or inductors as described for the semiconductor integrated circuit device according to the second and third embodiments, and the signal may be measured using a capacitive coupling or wireless non-contact signal transmission method. Furthermore, the signal may be measured by a method of measuring and analyzing, by using an EB probe and the like, secondary electron emitted from each node. In this case, the configuration added to the measurement node can be minimized to the degree of wiring pattern for improving measurement, so that additional circuit is no longer necessary to be added.

Furthermore, with respect to the semiconductor integrated circuit device of the present embodiment, the application of the present invention to the supply lines of a clock signal has been described, and however, it is obvious that the present invention is applicable regardless of circuit types if the semiconductor circuit device includes a signal node which requires a direct signal input from outside for the purpose of test, adjustment and the like. Accordingly, the driving signal for operating a whole or a part of the driven circuits 604a and 604b may be externally inputted instead of the clock signal used for shift register operation by the respective flip-flops 608a and 608b.

Fifth Embodiment

Figure 7B:
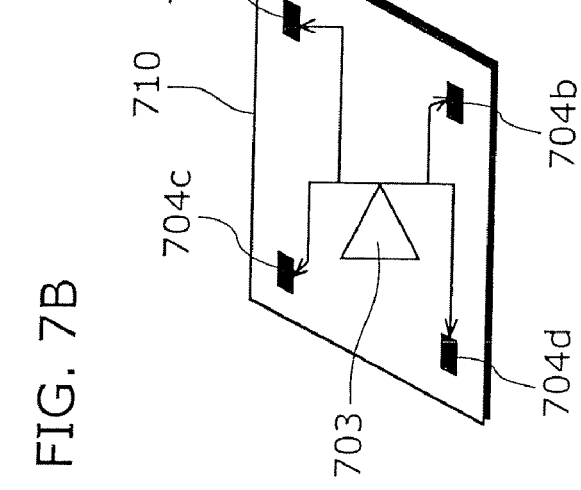
FIG. 7B is a diagram showing a schematic configuration of a second substrate of the semiconductor integrated circuit device.
Figure 7A:
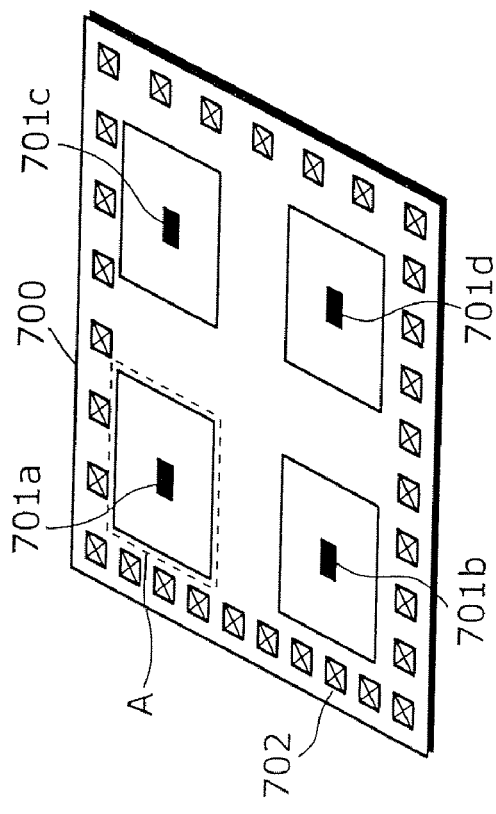
FIG. 7A is a diagram showing a schematic configuration of a first substrate of a semiconductor integrated circuit device according to a fifth embodiment of the present invention.
Figure 7C:
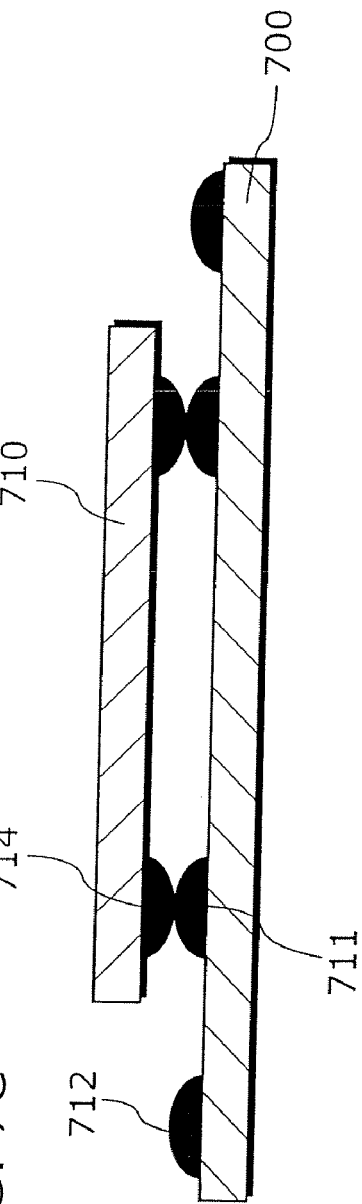
FIG. 7C is a diagram showing a connection state (connection state at the time of testing) of the first substrate and the second substrate of the semiconductor integrated circuit device.

FIGS. 7A, 7B, and 7C are diagrams, each of which showing a configuration of a semiconductor integrated circuit device according to the fifth embodiment of the present invention. FIG. 7A is a diagram showing a schematic configuration of an SLSI target chip which corresponds to a product die to be scan tested. FIG. 7B is a diagram showing a schematic configuration of a clock supply chip which supplies, as a test signal, a clock signal to a first substrate 700, namely a product die. FIG. 7C is a diagram showing a connection state of the first substrate 700 and a second substrate 710 at the time of testing.

The semiconductor integrated circuit device includes the first substrate 700 and the second substrate 710.

The first substrate 700 is a substrate on which plural circuit blocks (A in FIG. 7A) having the same configuration as the semiconductor integrated circuit device of the first embodiment are formed. As shown in FIG. 7A, the contact pads 701a, 701b, 701c, and 701d that are input points for the clock signals to be inputted to respective circuit blocks, and bonding pads 702 for inputting and outputting driving signals to the respective circuit blocks are arranged on the first substrate 700.

Each of the contact pads 701a, 701b, 701c, and 701d has the same function as the contact pad 105. An output of each of the contact pads 701a, 701b, 701c, and 701d is connected to somewhere between the clock node of the flip-flop which is a supply point of the clock signal and an input point of the clock buffer at the stage which is very close to the clock node, and the flip-flop is supplied with the clock signal from the external second substrate 710.

Contact balls 711 for flip-chip, which are contact points with the second substrate 710 are formed on the contact pads 701a, 701b, 701c, and 701d. Furthermore, contact balls 712 are formed on the bonding pads 702.

As shown in FIG. 7B, a super buffer 703 which is a supply source of a clock signal for generating the clock signal to be supplied to the first substrate 700, and the contact pads 704a, 704b, 704c, and 704d which are output points of the clock signal are arranged on the second substrate 710.

The super buffer 703 generates clock signals of the same phase, and supplies the generated clock signals respectively to the contact pads 704a, 704b, 704c, and 704d. The contact pads 704a, 704b, 704c, and 704d have the same configurations as the contact pads 701a, 701b, 701c, and 701d placed on the first substrate 700.

Contact balls 714 for flip-chip which are contact points with the first substrate 700 are formed on the contact pads 704a, 704b, 704c, and 704d. As shown in FIG. 7C, the contact pads 704a, 704b, 704c, and 704d are arranged so that the contact balls 714 and the contact balls 711 are placed over one another when the second substrate 710 is flipped around and one of the first substrate 700 and the second substrate 710 is placed over the other.

Note that, capacitive coupled pads having the same function as the capacitive coupled pad 305 or inductors having the same function as the inductor 505 may be formed on the first substrate 700 and the second substrate 710, instead of the contact pads 701a, 701b, 701c, 701d, and the contact pads 704a, 704b, 704c, and 704d.

Next, it shall be described about the operation of the semiconductor integrated circuit device having the aforementioned configuration at the time of scan testing.

At the time of scan testing, as shown in FIG. 7C, first, one of the first substrate 700 and the second substrate 710 is flipped around and placed over the other, and the contact pad 701a and the contact pad 704a, the contact pad 701b and the contact pad 704b, the contact pad 701c and the contact pad 704c, and the contact pad 701d and the contact pad 704d are respectively and electrically contacted. The mutually connected two substrates are thus placed on a testing device (a tester or an evaluation board) while being connected. Note that, the driving signal for driving the circuit block on the first substrate 700 is inputted by the testing device through the bonding pads 702 arranged on the first substrate 700.

Next, a signal is inputted through the bonding pads 702 placed on the first substrate 700 and the first substrate 700 is switched to the test operation mode for performing scan testing, in other words, to a test clock input mode. Specifically, as similar to the case of the semiconductor integrated circuit of the first embodiment, the driven circuit inside the circuit block is separated from the supply point for supplying a driving signal, and the contact point at which the first substrate 700 is contacted with the second substrate 710, which is the supply point of the clock signal, is connected to the driven circuit in the circuit block. Accordingly, the clock signal is supplied to the driven circuit in the circuit block.

Finally, after selecting defective chips through scan testing, the connection by which the first substrate 700 is contacted with the second substrate 710 is released, and the first substrate 700 is manufactured as a product.

As described in the above, in the semiconductor integrated circuit device of the present embodiment, the phase of the clock signal supplied to the second substrate 710 is adjusted by the super buffer and the strengthened wirings, and the clock signal is directly supplied to the first substrate 700. Accordingly, the phase of the clock node of the flip-flop which is the final supply point can be adjusted.

Furthermore, in the semiconductor integrated circuit device of the present embodiment, restrictions on power consumption and chip size can be relaxed with respect to the second substrate 710 designed for testing. Therefore, sufficient driving performance can be provided as a clock supply source.

Furthermore, according to the semiconductor integrated circuit device of the present embodiment, a semiconductor integrated circuit can be easily manufactured through fine processing using a semiconductor manufacturing device even in the case where the number of contact points at which the first substrate 710 is made contact with the second substrate 710 is increased. Here, the configuration of a circuit for testing formed on the second substrate 710 is generally simpler than that of the targeted circuit formed on the first substrate 700. Therefore, it is possible to design a circuit for testing using more inexpensive process which does not perform fine processing, and to reduce the testing cost.

Furthermore, according to the semiconductor integrated circuit device of the present embodiment, the second substrate 710 can be commonly used for the plural first substrates 700 by setting the arrangement information of the contact pads 701a, 701b, 701c and 701d as a common specification. Consequently, the processes required for designing can be significantly reduced.

Note that, whereas the example of applying the present invention to the supply line for supplying a clock signal is shown in the semiconductor integrated circuit device of the present embodiment, it is obvious that the present invention is applicable to any semiconductor integrated device including a signal node which requires a direct input of an external signal for the purpose of testing, adjustment and the like, regardless of the circuit types. Accordingly, a driving signal for driving a whole or a part of the circuit block may be externally inputted to the circuit block instead of the clock signal used for shift-register operation by the flip-flop.

Furthermore, a buffer tree having an adjustment function may be used for adjusting the phase of the clock signal in the second substrate 710, whereas a super buffer is used in the semiconductor integrated circuit device of the present embodiment.

Sixth Embodiment

Figure 8B:
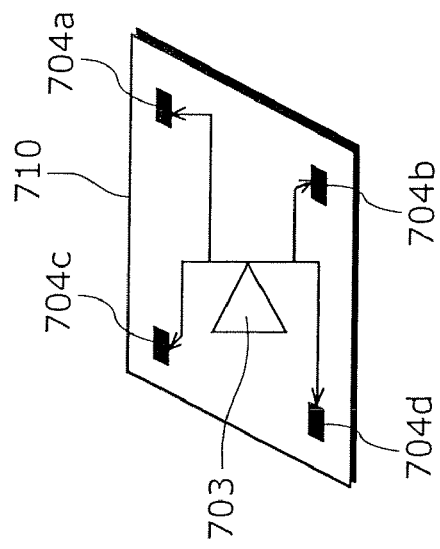
FIG. 8B is a diagram showing a schematic configuration of a second substrate of the semiconductor integrated circuit device.
Figure 8A:
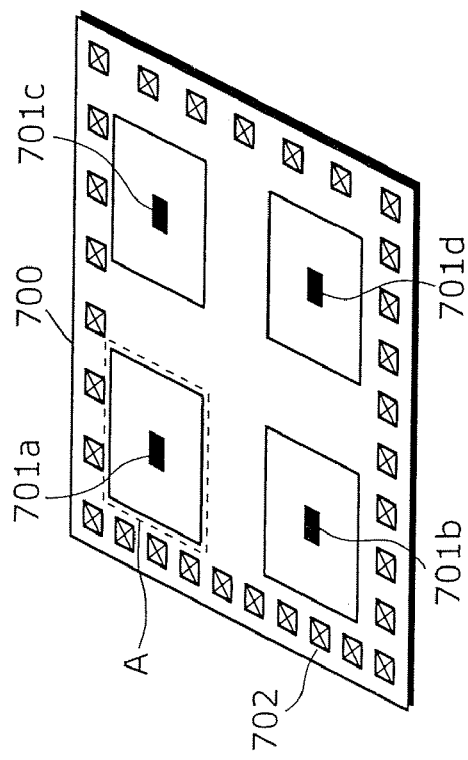
FIG. 8A is a diagram showing a schematic configuration of a first substrate of a semiconductor integrated circuit device according to a sixth embodiment of the present invention.
Figure 8C:
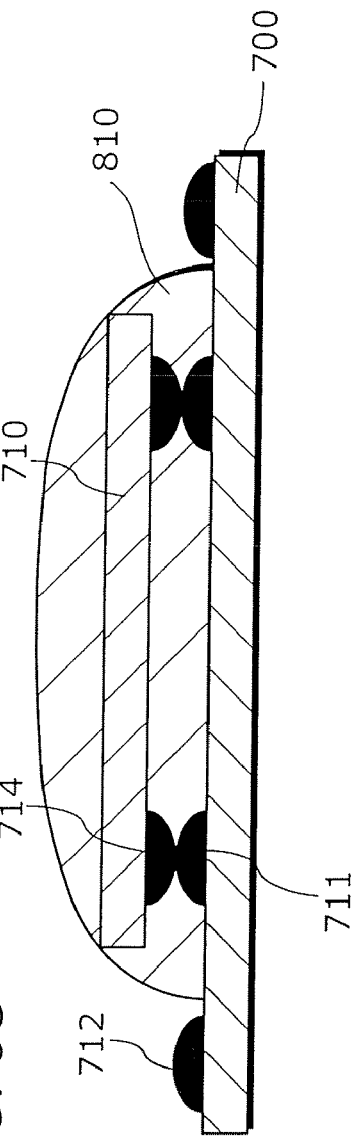
FIG. 8C is a diagram showing a connection state (connection state at the time of testing) of the first substrate and the second substrate of the semiconductor integrated circuit device.

FIGS. 8A, 8B, and 8C are diagrams, each of which showing a configuration of a semiconductor integrated circuit device according to the sixth embodiment of the present invention. FIG. 8A is a diagram showing a schematic configuration of the first substrate 700, which is an SLSI target chip corresponding to a product die to be scan tested. FIG. 8B is a diagram showing a schematic configuration of a clock supply chip which supplies a clock signal as a test signal to the first substrate 700, which is a product die. FIG. 8C is a diagram showing a connection state of the first substrate 700 and a second substrate 710.

This semiconductor integrated circuit device is made up of the first substrate 700 and second substrate 710 that have the same configurations as those of the substrates in the fifth embodiment. However, this semiconductor integrated circuit device is different from the semiconductor integrated circuit device of the fifth embodiment in that the first substrate 700 and the second substrate 710 are molded with the resign 810 while being connected to each other.

The first substrate 700 is a substrate in which plural circuit blocks (A in FIG. 8A) having the same configuration as the semiconductor integrated circuit device of the first embodiment are formed. As shown in FIG. 8A, the contact pads 701a, 701b, 701c, and 701d, and bonding pads 702 are arranged on the substrate.

The contact balls 711 are formed on the contact pads 701a, 701b, 701c and 701d. Furthermore, the contact balls 712 are formed on the bonding pads 702.

As shown in FIG. 8B, a super buffer 703, and contact pads 704a, 704b, 704c, and 704d are arranged on the second substrate 710.

The contact balls 714 are formed on the contact pads 704a, 704b, 704c and 704d.

Next, the operation of the semiconductor integrated circuit having the aforementioned configuration shall be described.

In the integrated circuit device, as shown in FIG. 8C, first, one of the first substrate 700 and the second substrate 710 is flipped around and placed over the other, and the contact pad 701a and the contact pad 704a, the contact pad 701b and the contact pad 704b, the contact pad 701c and the contact pad 704c, and the contact pad 701d and the contact pad 704d are electrically connected to each other. Then, these two mutually connected substrates are molded with resin 810 while being connected to each other. An external signal is inputted through the bonding pads 702 placed on the first substrate 700.

Next, a signal is inputted through the bonding pads 702 placed on the first substrate 700, and the first substrate 700 is switched to a test operation mode for performing scan testing, namely a test clock input mode. Specifically, as in the case of the semiconductor integrated circuit of the first embodiment, the driven circuit in the circuit block is separated from the supply point of a driving signal, and a contact point at which the first substrate 700 is made contact with the second substrate 710, which is a supply point of a clock signal, is connected to the driven circuit in the circuit block. Accordingly, the clock signal is supplied to the driven circuit in the circuit block.

Finally, after selecting defective chips through scan testing, the operation mode is switched to the normal operation mode and the semiconductor integrated circuit device is functioned as a product. In the mode other than the test operation mode, the second substrate 710 is switched to the low power consumption mode. Therefore, when being manufactured through low leakage process, the second substrate 710 rarely consume power being switched to the low power consumption mode such as a mode of stopping clock signal generation and the like.

As described in the above, in the semiconductor integrated circuit device of the present embodiment, the phase of the clock signal in the second substrate 710 is adjusted by the super buffer and the strengthened wirings, and the clock signal is directly supplied to the first substrate 700. Accordingly, the phase of the clock node of the flip-flop which is the final supply point can be adjusted.

Furthermore, in the semiconductor integrated circuit device of the present embodiment, restrictions on power consumption and chip size can be relaxed with respect to the second substrate 710 designed for testing. Therefore, sufficient driving performance can be provided as a clock supply source.

Furthermore, according to the semiconductor integrated circuit device of the present embodiment, a semiconductor integrated circuit can be easily manufactured through fine processing using a semiconductor manufacturing device even in the case where the number of contact points at which the first substrate 710 is made contact with the second substrate 710 is increased. Here, the configuration of a circuit for testing formed on the second substrate 710 is generally less complicated than that of the targeted circuit formed on the first substrate 700. Therefore, it is possible to design a circuit for testing using more inexpensive process which does not perform fine processing, and to reduce testing cost.

Furthermore, according to the semiconductor integrated circuit device of the present embodiment, the second substrate 710 can be configured as a transistor which causes lower leakage, and the first substrate 700 can be configured as a high-speed transistor with a low threshold allowing some leakage. Therefore, it is possible to reduce the amount of leakage by configuring the circuit on the second substrate with the low leakage transistor, while realizing high performance of the circuit on the first substrate 700. In other words, when the circuit, which drives a large load such as clock driving, reduces the slew rate, the gate width of the circuit is generally increased, causing an increase in leak current. On the contrary, in the semiconductor integrated circuit device of the present embodiment, it is unnecessary to suddenly increase the slew rate more than necessary only for testing. Therefore, it is possible to optimize the transistor size for the first substrate 700 as well as the transistor size for the second substrate 710.

Furthermore, according to the semiconductor integrated circuit device of the present embodiment, the second substrate 710 can be commonly used for the plural first substrates 700 by setting the arrangement information of the contact pads 701*a*, 701*b*, 701, and 701*d* as a common specification. Consequently, the processes required for designing can be significantly reduced.

Note that, it has been explained the example that a signal for switching a mode is inputted via the bonding pad placed on the first substrate 700, and the supply of the clock signal from the second substrate 710 is enabled after scan testing is performed, in the semiconductor integrated circuit device of the present embodiment. However, it is also possible to configure the control unit placed on the first substrate 700 to control the switches so that the switch which connects the driven circuit with the driving unit in the circuit block and the switch which connects the driven circuit with the transmitting unit are frequently switched ON/OFF, so that the test operation mode is periodically driven. In this case, with the combination of the built-in self test function (BIST), it is possible to realize a fail-safe mechanism such as a configuration of a system LSI with a self-correction function. Here, the self-correction function is a function of transmitting failure information or replacing the failed circuit with a prepared redundant circuit, when checking whether or not a failure occurs due to aged deterioration and determining that the failure occurred. In recent years, the demand for semiconductor integrated circuit device has been increased for the increasing use such as on-vehicle microcomputer and the like which requires high reliability. Therefore, the present invention is useful as a semiconductor integrated circuit device which configures a highly stable system.

Note that, whereas the example of applying the present invention to the supply line for supplying a clock signal is shown in the semiconductor integrated circuit device of the present embodiment, it is obvious that the present invention is applicable to any semiconductor integrated device including a signal node which requires a direct input of an external signal for the purpose of testing, adjustment and the like despite the circuit types. Accordingly, a driving signal for driving a whole or a part of the circuit block may be externally inputted to the circuit block instead of the clock signal used for shift-register operation by the flip-flop.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention can be used for a semiconductor integrated circuit device, particularly for a semiconductor integrated circuit and the like useful for a test assemble method for a large-scaled circuit designed based on intellectual properties.

What is claimed is:

1. A semiconductor integrated circuit device, comprising:
   a driving unit which is connected to a circuit via a transmission line and which is operable to supply, to the circuit, a driving signal for driving the circuit;
   a first switch which is inserted into the transmission line between the circuit and said driving unit and which is operable to cause the driving signal, which is to be supplied to the circuit, to flow or to be cut off; and
   a transmission unit which is connected to the transmission line between said first switch and the circuit and which is operable to transmit, to the circuit, an external signal supplied from outside said semiconductor integrated circuit device instead of the driving signal.

2. The semiconductor integrated circuit device according to claim 1, comprising
   a measurement unit operable to output a signal transmitted to the circuit.

3. The semiconductor integrated circuit device according to claim 1, comprising
   a control unit operable to turn said first switch on when said semiconductor integrated circuit device is operated in a normal mode, and operable to turn said first switch off when said semiconductor integrated circuit device is operated in a test mode.

4. The semiconductor integrated circuit device according to claim 1,
   wherein said first switch is a tri-state buffer.

5. The semiconductor integrated circuit device according to claim 1,
   wherein said first switch is a CMOS switch.

6. The semiconductor integrated circuit device according to claim 1,
   wherein said transmission unit includes:
   a pad to which the external signal is supplied; and
   a second switch which is connected to a transmission line between said first switch and the circuit and which is operable to cause the external signal sent from said paid to flow or to be cut off.

7. The semiconductor integrated circuit device according to claim 1,
   wherein said transmission unit includes:
   a capacitive coupled pad to which the external signal is supplied; and
   a second switch which is connected to a transmission line between said first switch and the circuit and which is operable to cause the external signal sent from said capacitive coupled pad to flow or to be cut off.

8. The semiconductor integrated circuit device according to claim 1,
   wherein said transmission unit includes:

an inductor to which the external signal is supplied and which serves as an antenna; and a second switch which is connected to the transmission line between said first switch and the circuit and which is operable to cause the external signal sent from said inductor to flow or to be cut off.

9. The semiconductor integrated circuit device according to claim 1, wherein the external signal is a clock signal.

10. The semiconductor integrated circuit device according to claim 1, comprising:

a plurality of said circuits, driving units, first switches, and transmission units, wherein each of said driving units is connected to one of said circuits via a transmission line and which is operable to supply, to the connected circuit, a driving signal for driving the connected circuit, each of said first switches is inserted into the transmission line between a respective one of said circuits and a respective one of said driving units, and is operable to cause the driving signal supplied to said connected circuit to flow or to be cut off, and each of said transmitting units is connected to the transmission line between a respective one of said switches and a respective one of said circuits, and is operable to transmit the external signal to said connected circuit instead of the driving signal.

11. The semiconductor integrated circuit device according to claim 1, comprising:

a first substrate in which said circuit, driving unit, first switch and transmission unit are formed; and a second substrate which is connected to said transmission unit and on which a generation unit which generates the external signal is formed.

12. The semiconductor integrated circuit device according to claim 11, comprising a control unit operable to control said first switch so that said first switch is periodically turned ON and OFF.

13. A method for testing the semiconductor integrated circuit device, wherein the semiconductor integrated circuit device includes:

a driving unit which is connected to a circuit via a transmission line and which is operable to supply, to the circuit, a driving signal for driving the circuit;

a first switch which is inserted into the transmission line between the circuit and the driving unit and which is operable to cause the driving signal, which is to be supplied to the circuit, to flow or to be cut off; and a transmission unit which is connected to the transmission line between the first switch and the circuit and which is operable to transmit, to the circuit, an external signal supplied from outside the semiconductor integrated circuit device instead of the driving signal, a generation unit, which is operable to generate a test signal as the external signal, is formed on a second substrate that is different from a first substrate on which the semiconductor integrated circuit device is formed, and said method comprises supplying the test signal to the semiconductor integrated circuit device by placing one of the first substrate and the second substrate over the other so that the generation unit is connected to the transmission unit.

14. A method of driving the semiconductor integrated circuit device, wherein the semiconductor integrated circuit includes:

a driving unit which is connected to a circuit via a transmission line and which is operable to supply, to the circuit, a driving signal for driving the circuit;

a first switch which is inserted into the transmission line between the circuit and the driving unit and which is operable to cause the driving signal, which is supplied to the circuit, to flow or to be cut off; and a transmission unit which is connected to the transmission line between the first switch and the circuit and which is operable to transmit, to the circuit, an external signal supplied from outside the semiconductor integrated circuit device instead of the driving signal, said method comprises:

supplying only the driving signal to the circuit in the case where the semiconductor integrated circuit device is operated in a normal mode, by turning the first switch on and preventing the external signal to be supplied to the circuit; and supplying only the external signal to the circuit in the case where the semiconductor integrated circuit device is operated in a test mode, by turning the first switch off and allowing the external signal to be supplied to the circuit.

* * * * *